US008829670B1

(12) United States Patent
Zhang et al.

(10) Patent No.: US 8,829,670 B1
(45) Date of Patent: Sep. 9, 2014

(54) THROUGH SILICON VIA STRUCTURE FOR INTERNAL CHIP COOLING

(71) Applicants: STMicroelectronics, Inc., Coppell, TX (US); International Business Machines Corporation, Armonk, NY (US)

(72) Inventors: John H. Zhang, Fishkill, NY (US); Lawrence A. Clevenger, LaGrangeville, NY (US); Carl Radens, LaGrangeville, NY (US); Yiheng Xu, Hopewell Junction, NY (US); Edem Wornyo, Danbury, CT (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/931,688

(22) Filed: Jun. 28, 2013

(51) Int. Cl.
*H01L 23/34* (2006.01)
*H01L 21/50* (2006.01)
*H01L 21/44* (2006.01)
*H01L 23/46* (2006.01)
*H01L 23/473* (2006.01)
*H01L 21/48* (2006.01)

(52) U.S. Cl.
CPC .............. *H01L 23/473* (2013.01); *H01L 21/48* (2013.01)
USPC ............... 257/714; 257/713; 257/E23.097; 257/E23.098; 438/122

(58) Field of Classification Search
CPC .............................. H01L 23/473; H01L 23/46
USPC .................. 257/713, 714, E23.097, E23.098; 438/122
See application file for complete search history.

(56) References Cited

U.S. PATENT DOCUMENTS

| | | | | |
|---|---|---|---|---|
| 5,239,200 A | * | 8/1993 | Messina et al. | 257/714 |
| 6,257,320 B1 | * | 7/2001 | Wargo | 165/80.4 |
| 6,796,370 B1 | | 9/2004 | Doll | |
| 6,986,382 B2 | * | 1/2006 | Upadhya et al. | 165/80.4 |
| 2013/0150790 A1 | | 6/2013 | Palmieri | |

* cited by examiner

*Primary Examiner* — Luan C Thai
(74) *Attorney, Agent, or Firm* — Seed IP Law Group PLLC

(57) ABSTRACT

The present disclosure is directed to a device that includes a first substrate having a first plurality of hollow pillars on the first substrate and a first plurality of channels in the first substrate coupled to the first plurality of hollow pillars. The device includes a second substrate attached to the first substrate, the second substrate having a second plurality of hollow pillars on the second substrate and a second plurality of channels in the second substrate coupled to the second plurality of hollow pillars, the first plurality of hollow pillars being coupled to the second plurality of hollow pillars to allow a fluid medium to move through the substrate to cool the first substrate and the second substrate.

18 Claims, 20 Drawing Sheets

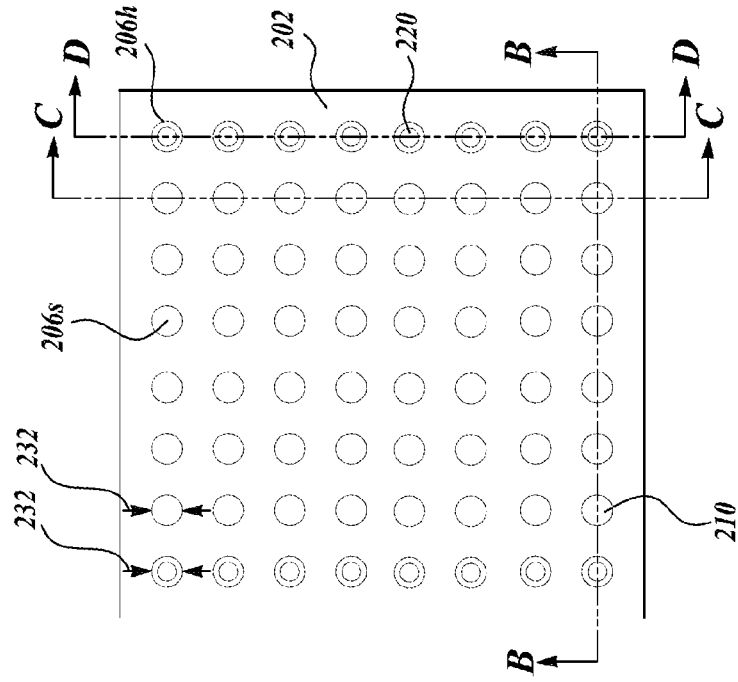
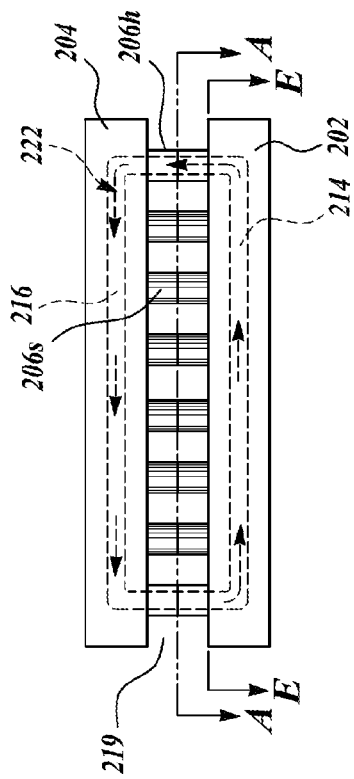
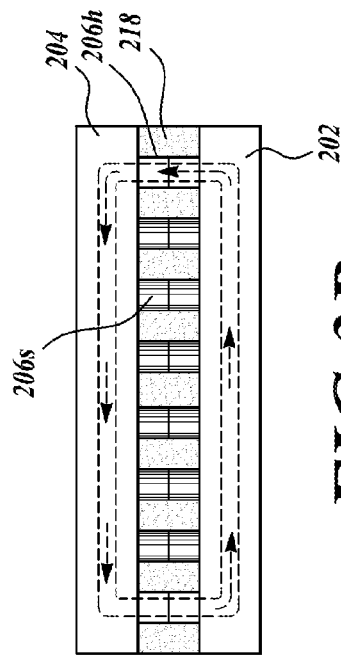
FIG. 4 (A - A)
FIG. 3A
FIG. 3B

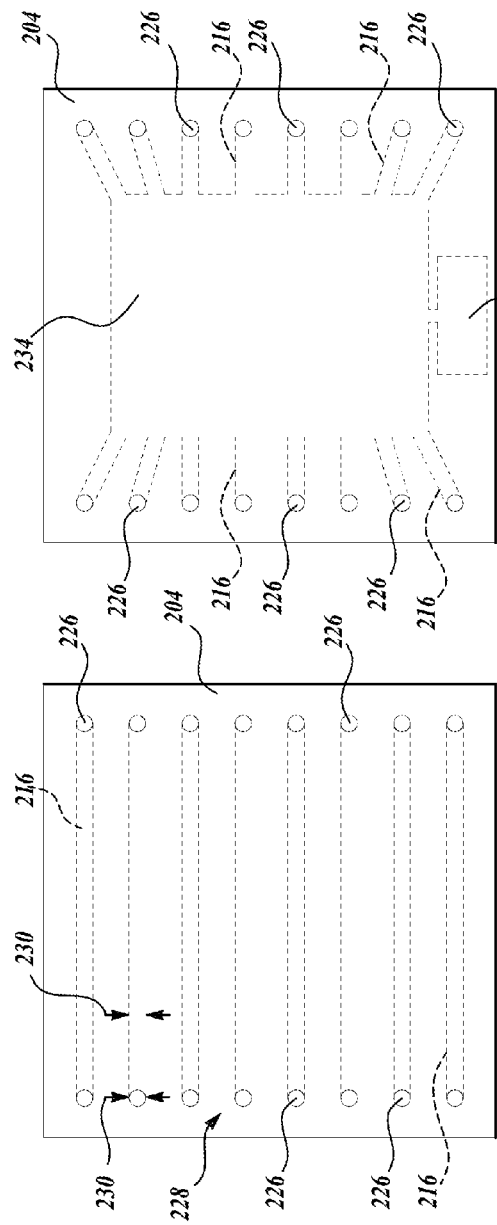
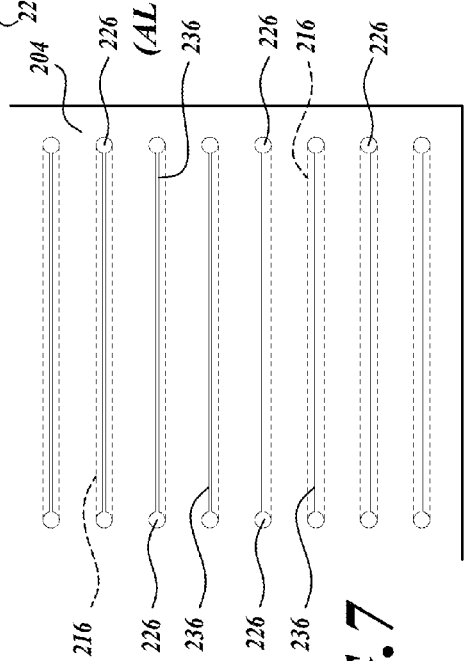
FIG.5 (E-E)
FIG.6 (E-E) (ALTERNATIVE)
FIG.7

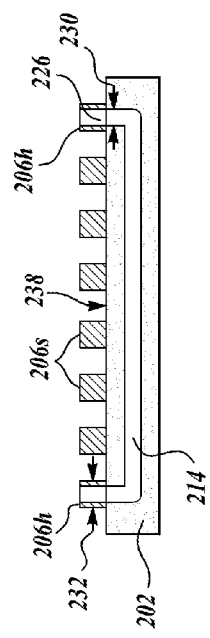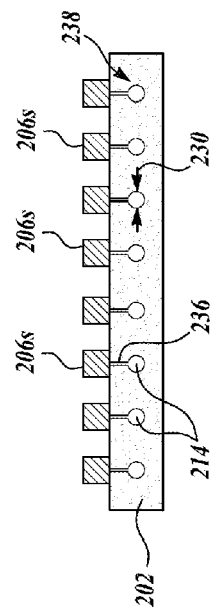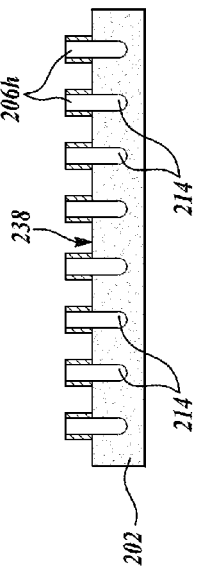

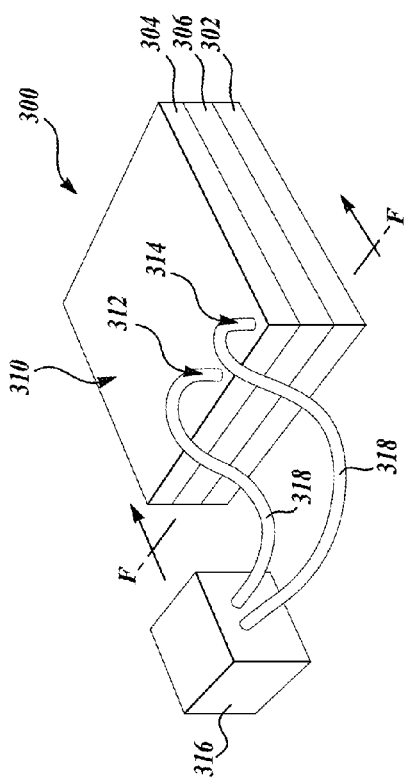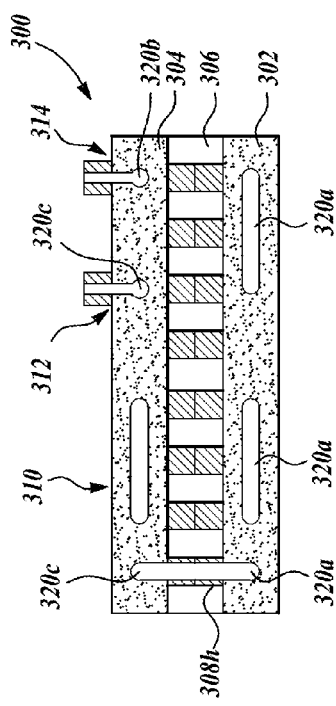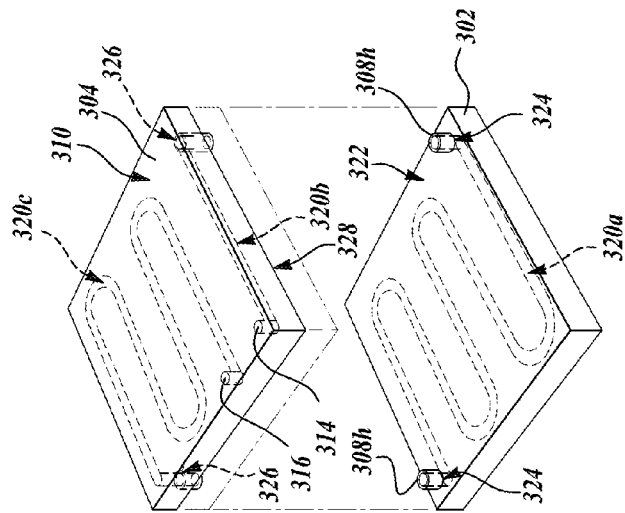

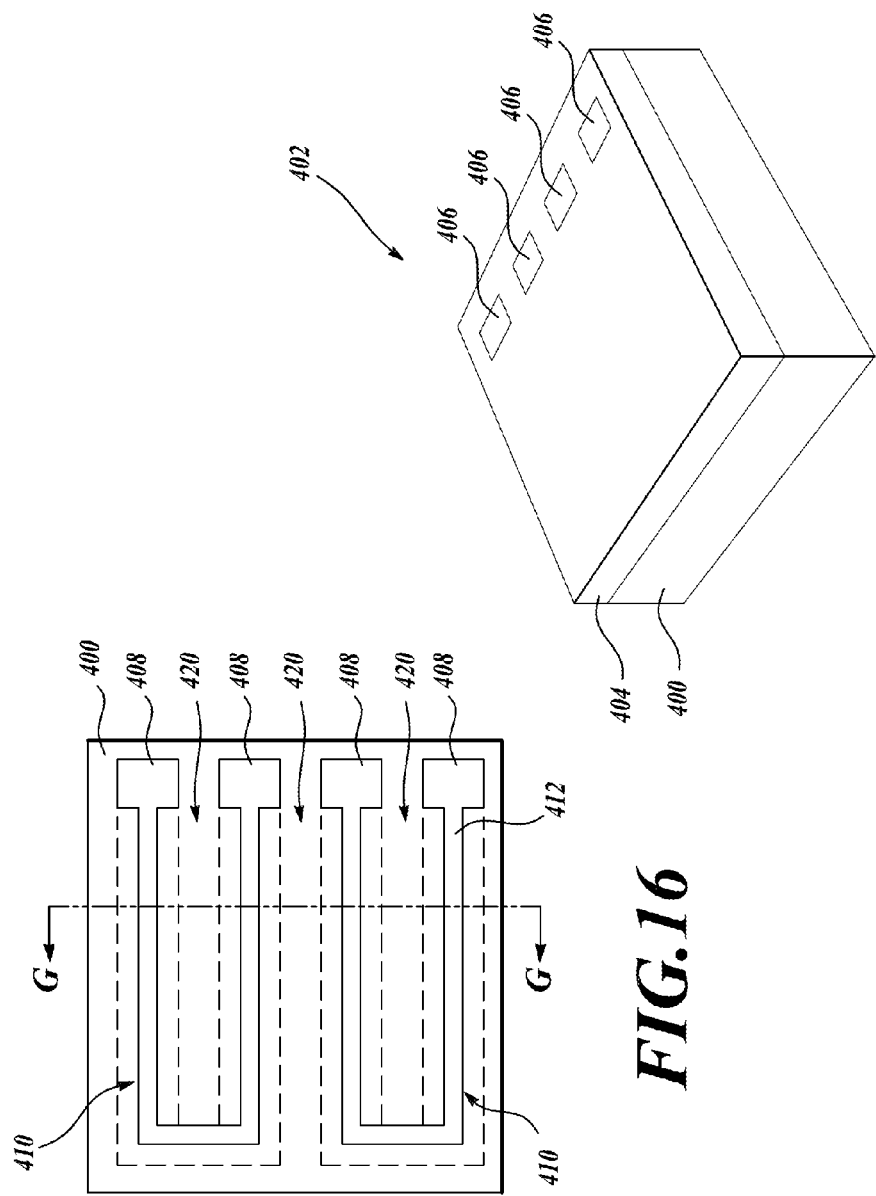

THROUGH SILICON VIA STRUCTURE FOR INTERNAL CHIP COOLING

BACKGROUND

1. Technical Field

The present disclosure is directed to a plurality of through silicon via structures formed in a substrate for internal cooling of a chip.

2. Description of the Related Art

As semiconductor devices get smaller and denser, heat dissipation becomes more and more of an issue. Current methods of dealing with heat dissipation for semiconductor chips include attaching external heat sinks to a package after assembly. For example, personal computers often include fan-cooled heat sinks positioned on top of a processor to help control the temperature of the processor.

Heat sinks transfer heat from a higher temperature to a lower temperature fluid medium. In many cases, the fluid medium is air; however, liquids, such as water, refrigerants, and oils may be used.

FIG. 1 is a version of a known heat sink 100 attached to a top surface 102 of a package 104. The package 104 includes a die 106 housed in an encapsulation material 108. A plurality of wires 110 couple the die 106 to the printed circuit board 112.

The heat sink 100 includes a plurality of prongs 114 extending upward from a base 116. Heat sinks such as the heat sink 100 are typically made of copper, which has a high thermal conductivity that moves the heat away from the die 106. This heat sink 100 relies on air to dissipate the heat transferred away from the die.

BRIEF SUMMARY

The present disclosure is directed to a device and method for cooling a substrate in situ. For example, a device that includes a first substrate having a first plurality of hollow pillars on the first substrate and a first plurality of channels in the first substrate coupled to the first plurality of hollow pillars. The device includes a second substrate attached to the first substrate, the second substrate having a second plurality of hollow pillars on the second substrate and a second plurality of channels in the second substrate coupled to the second plurality of hollow pillars, the first plurality of hollow pillars being coupled to the second plurality of hollow pillars to allow a fluid medium to move through the substrate to cool the first substrate and the second substrate.

BRIEF DESCRIPTION OF THE SEVERAL VIEWS OF THE DRAWINGS

FIGS. 3A and 3B are right side views of the stacked substrates of FIG. 2 according to various embodiments of the present disclosure;

FIG. 4 is a view of a first substrate or the second substrate of the stacked substrates of FIG. 2, which have been separated along the line AA of FIG. 3;

FIGS. 5-7 are alternative views of the second substrate without any pillars, which corresponds to the line EE of FIG. 3;

FIG. 8 is a cross-sectional view taken through the cross-section line BB of FIG. 4;

FIG. 9 is a cross-sectional view taken through the cross-section line CC of FIG. 4;

FIG. 10 is a cross-sectional view taken through the cross-section line DD of FIG. 4;

FIG. 11 is an isometric view of an alternative embodiment of a package according to the present disclosure;

FIG. 12 is a cross-sectional view of the package taken through the cross-section line F-F of FIG. 11;

FIG. 13 is a simplified, exploded view of the package of FIG. 11;

FIG. 16 is a top down view of a substrate formed in accordance with an alternative embodiment of the present disclosure;

FIG. 17 is an isometric view of a package according to the present disclosure.

DETAILED DESCRIPTION

Figure 1:
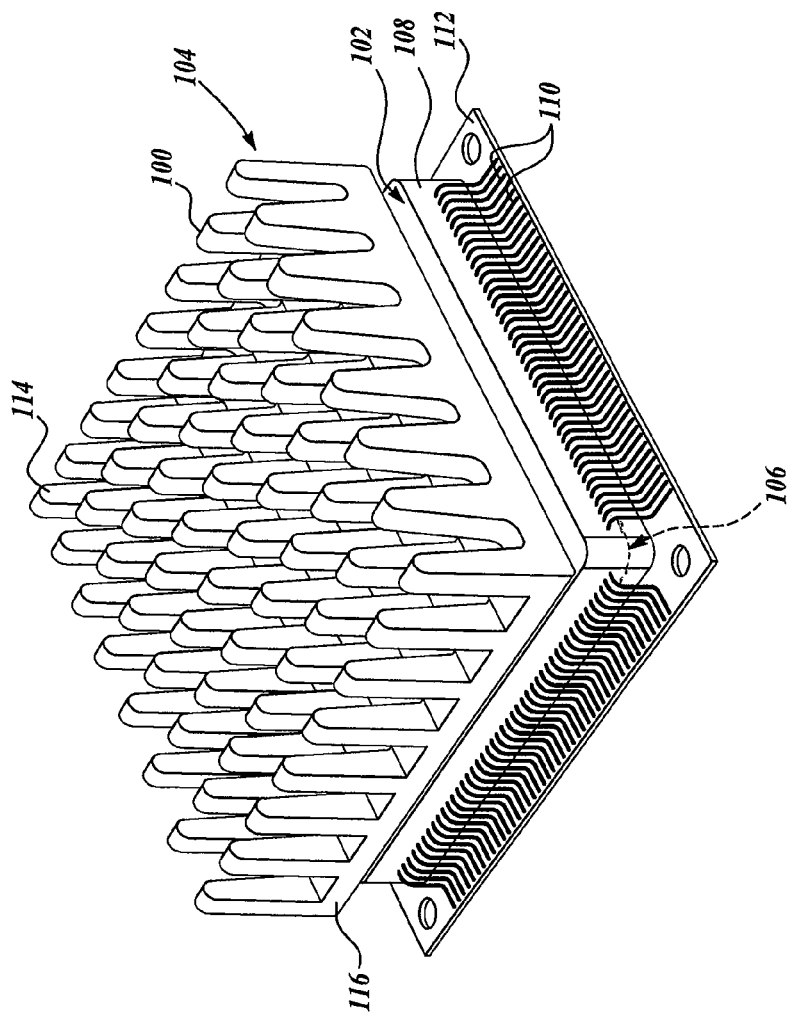
FIG. 1 is an isometric view of a known heat sink coupled to a package.

In the following description, certain specific details are set forth in order to provide a thorough understanding of various embodiments of the disclosure. However, one skilled in the art will understand that the disclosure may be practiced without these specific details. In some instances, well-known structures associated with semiconductor manufacturing have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale, but in many instances, do reflect actual scale and relative size between the components.

Figure 2:
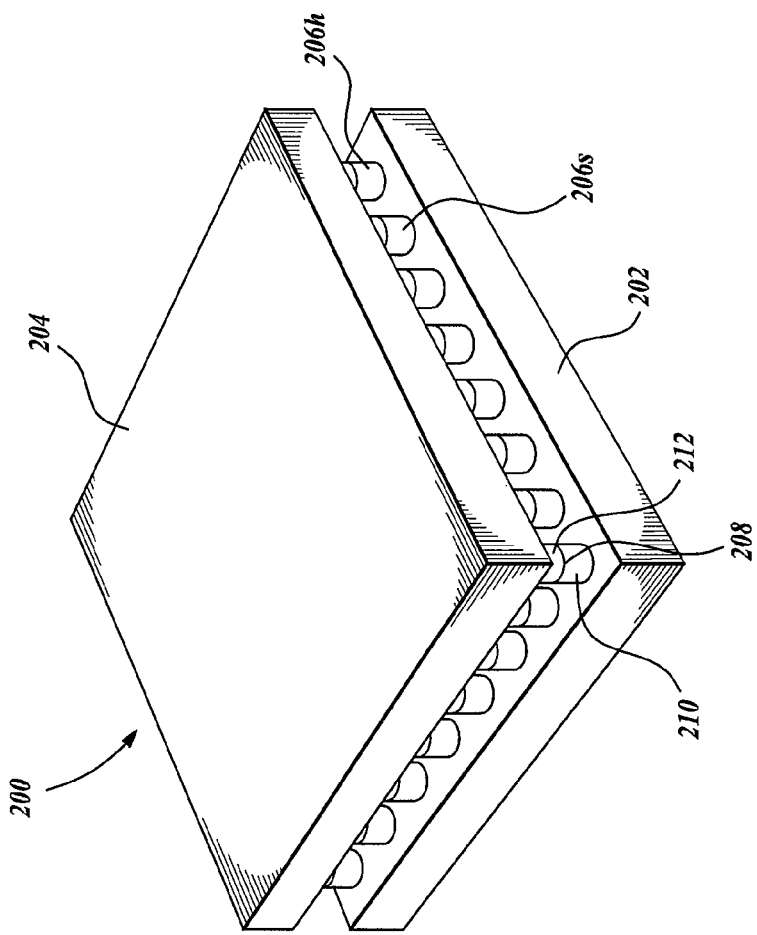
FIG. 2 is an isometric view of stacked substrates formed in accordance with the present disclosure.

FIG. 2 is an isometric view of stacked substrates 200 formed in accordance with an embodiment of the present disclosure. The stacked substrates 200 include a first substrate 202 and a second substrate 204. A plurality of pillars 206 separates the first substrate 202 from the second substrate 204. The pillars 206 include a first portion 210 associated with the first substrate and a second portion 212 associated with the second substrate 204. A seam 208 can be seen centrally positioned in each pillar 206 and corresponds to a location where the first portion 210 and the second portion 212 are bonded together. In other embodiments, the pillars 206 may be only a single portion that is associated with one or the other substrate, such that the single portion bonds directly to the substrate without a pillar.

There are two types of pillars 206 between the stacked substrates 200. A first type of pillar 206 is a hollow pillar 206h. A second type of pillar 206 is a solid pillar 206s. In this embodiment, there are 16 hollow pillars 206h and 48 solid pillars 206s. For example, as can be seen in FIGS. 3A, 3B, and 4, a right-most column and a left-most column of pillars are hollow pillars 206h. The pillars in the center of the array of pillars are solid pillars 206s.

The hollow pillars 206h are coupled to a respective channel 214, 216, in each substrate 202, 204. The channels 214, 216 are coupled together through the hollow pillars 206h.

The present disclosure is directed to providing the channels 214, 216 to allow a fluid medium 222 to flow through each substrate 202, 204 to cool each substrate during operation without needing an external heat sink. As will be described in more detail below, each substrate 202, 204 may include a plurality of transistors, resistors, metal interconnects, and other active and passive components sufficient to form an ASIC. By forming these cooling channels 214, 216, in the substrates 202, 204, the overall size constraints for a heat sink are dramatically reduced.

In addition, as more companies move towards stacking die, the thermal demands become more complicated to address. The present disclosure provides an in chip cooling system that allows stacked substrates to be coupled together electrically and through the cooling system.

For example, the pillars 206 may be formed from an electrically conductive material, such as a metal, like copper. The pillars, both the hollow pillars 206h and the solid pillars 206s can be configured to transmit an electrical signal from the first substrate to the second substrate.

In alternative embodiments, one of the substrates, such as substrate 202, will include active circuitry while the other substrate 204 may be a cap that is configured to complete the fluid flow to cool the active circuitry in the substrate 202. For example, the substrate 204 may include a pump 224 and the channel 216 without any other active circuitry such that the pump 224 in the substrate 204 continues to move fluid through the substrate 202 during operation; see FIG. 6.

In FIG. 3A, the pillars 206h, 206s are separated from each other by air which allows for additional heat dissipation, similar to known heat sinks that move the heat into copper fins that dissipate heat as air flows through the fins. The arrangement in FIG. 3A is directed to having an open air cavity 219 with pillars 206 configured to transfer heat from either or both of the first substrate and the second substrate. A fan or other air movement device may be included on a printed circuit board with the arrangement of FIG. 3A to move air through the cavity 219 to continue the heat transfer away from the first and second substrates.

Both the first substrate and the second substrate 202, 204 may include active circuitry such that both substrates are generating heat during operation. In addition, the active circuitry in the first substrate could be coupled to the active circuitry in the second substrate to transmit data through the solid pillars 206s. The hollow pillars may also transmit data from one of the substrates to the other. The pillars 206 are formed from the first portions and the second portions 210, 212, which are bonded together after an alignment process.

In FIG. 3B, the hollow pillars 206h and the solid pillars 206s are separated from each other by a dielectric 218. In one embodiment, the pillars are formed from copper, which is a good thermal conductor and transfers heat away from the active circuitry in addition to the fluid moving through the channels 214, 216 and the hollow pillars 206h.

FIG. 4 is a view of the first substrate 202 or the second substrate 204 looking at the first half or the second half of the pillars, respectively. The first substrate 202 was separated from the second substrate 204 at the seam 208. From this view, it can be seen that the solid pillars 206s have no openings while the hollow pillars 206h have a central opening 220, which makes them hollow. More particularly, the first substrate and the second substrate have the same array of pillars in this embodiment. In other embodiments, the first array and the second array may be in a different pattern or have a different number of pillar portions.

FIG. 5 is a bottom view of the second substrate 204 with the pillars 206 removed. As noted above, this could also be the first substrate 202, since they are duplicates of each other in some embodiments. There are 8 parallel channels 216 in this embodiment, which are all parallel running from left to right in this Figure; however, other numbers of channels may be included. In addition, the hollow pillars may be spaced in different ways. For example, instead of having hollow pillars adjacent to each other, there may be a solid pillar positioned between adjacent hollow pillars.

Openings 226 through a surface 228 of the substrate 204 provide access to the channels 216. The openings 226 have a same diameter 230 as channel 216, which can be seen more clearly in FIGS. 8 and 10. The openings are smaller than a diameter 232 of the pillars 206, such that the openings correspond to the diameter 230 of the hollow portion of the pillars 206.

If both substrates include active circuitry, the thermal issues may potentially be higher with twice the number of active transistors; however, it is likely that not all sections of the circuitry will be active at the same time such that a portion in a first corner of the first substrate may be generating heat while a portion of the second substrate in a second corner opposite to the first corner of the first substrate may be generating heat. Since these two heated areas are separate from each other, the thermal dissipation of these two areas may be separate because they are associated with different channels 216. Chip designers can select an arrangement of one substrate with respect to a second substrate so that active areas that generate the most heat are positioned away from each other to maximize the transfer of heat away from these areas in the event they are both running hot at the same time.

In an alternative design, a processor may be formed in the first substrate and memory may be formed in the second substrate. The processor will generate a significant amount of heat while the memory will generate very little, if any. In another embodiment, an ASIC may be paired with a MEMS substrate, where the MEMS substrate will generate little heat and can provide an area in its substrate for heat dissipation of the ASIC.

In other embodiments, the pillars may be formed after the substrate has been put into an encapsulant or other packaging material. For example, in place of the electrical connections for chips that are packaged in a land grid array or ball grid array, the pillars may be formed where the grid array was formed in order to couple the chip to another chip or to a cooling device.

FIG. 6 is an alternative bottom view of the substrate 204, which includes a chamber 234 into which all of the channels 216 flow as inputs and outputs. There could be a plurality of chambers that are shared by various channels. The pump 224 is formed in the substrate 204 adjacent to the chamber 234 and configured to move the fluid through the path provided by the stacked substrates. The pump 224 may be a microfluidic pump, such as one described in U.S. Patent Publication Number 2013-0150790, which is incorporated by reference in its entirety. In this embodiment, the first substrate 202 may include active circuitry while the second substrate 204 includes the chamber and the pump.

FIG. 7 is an alternative bottom view of the substrate 204 formed in accordance with another embodiment of the present disclosure. In particular, the substrate 204 may include a trench 236. The trench 236 provides an opening, through which the channel 216 is formed, i.e., the channel is etched from the top down through the trench 236. More information about the trench will be described in more detail below.

FIG. 8 is a cross-sectional view of the first or second substrate 202, 204 of FIG. 4, taken along the line BB. The orientation in FIG. 8 corresponds to the first substrate 202 and will be referenced as the first substrate 202; however, as has been discussed herein, the first and second substrate may have identical cooling structures in some embodiments.

There are two hollow pillars 206h and six solid pillars 206s positioned on a surface 238 of the substrate 202. The two hollow pillars 206h are the left-most and right-most pillars along this cross-section line. In other embodiments, the two hollow pillars 206h may not be the left-most and right-most pillars. The hollow pillars 206h couple to the channel 214.

The diameter 230 of opening 226 is the same as the diameter of the channel 214 and the hollow portion of the hollow pillars 206h.

FIG. 9 is a cross-sectional view of the first substrate 202 taken along cross-section line CC of FIG. 4, through eight solid pillars 206s. The channels 214 run in and out of the substrate, beneath the array of solid pillars 206s, see FIG. 4. The embodiment in FIG. 9 corresponds to FIG. 7 where the trench 236 is used to form the channels 214. The trench 236 is significantly smaller than the diameter 230 of the channels 214.

FIG. 10 is a cross-sectional view of the first substrate 202 taken along cross-section line DD, which passes through eight hollow pillars 206h. The hollow portions align with the channel to move the fluid up or down through the hollow pillars 206h during use.

FIG. 11 is an isometric view of an alternative arrangement of stacked substrates 300 formed in accordance with another embodiment of the present disclosure. FIG. 12 is a cross-sectional view of the stacked substrates 300 taken through cross-section line F-F of FIG. 11. FIG. 13 is a simplified and expanded isometric view of the stacked substrates 300 of FIG. 11.

A first substrate 302 is separated from a second substrate 304 by a dielectric layer 306. The dielectric 306 includes a plurality of pillars 308 that thermally separate the first substrate from the second substrate, support the first substrate and the second substrate, provide electrical connections between the first substrate and the second substrate in some embodiments, and transfer cooling fluid between the first substrate and the second substrate. Some of the pillars are hollow pillars 308h and some of the pillars are solid pillars 308s.

A top surface 310 of the second substrate includes a first opening 312 and a second opening 314, which are coupled to a manifold 316 via connection pipes 318. There may be more openings and more pipes in other embodiments. As can be seen in FIGS. 12 and 13, channels 320a, 320b, and 320c are formed in the first and the second substrates, respectively, and are coupled together to form a single channel 320 through the stacked substrates.

A top surface 322 of the first substrate 302 includes two openings 324 positioned at opposite corners of the top surface 322. There is one circuitous channel 320a in the first substrate that winds its way from one opening to the other. Only the hollow pillars 308h are shown in FIG. 13; however, many other pillars, such as the solid pillars 308s in FIG. 12, may be included on this surface 322.

The hollow pillars 308h couple to openings 326 formed in a bottom surface 328 of the second substrate. The openings 326 couple the channel 320a from the first substrate to the channels 320b, 320c of the second substrate.

The manifold 316 may be any number of shapes and sizes. The manifold is configured to receive the fluid medium from one of the openings after the fluid medium has traveled through the channels 320 to transport heat through the stacked substrate. The manifold cools the fluid medium and inputs the cooled medium into the second substrate to continue to cool the stacked substrates. The manifold may include a pump or other device to move the fluid medium into and out of the stacked substrates. The pump may be formed internally with respect to the substrates, as mentioned above, or the pump may be formed externally with respect to the substrates, such as the manifold.

The fluid medium may be a variety of materials, including, but not limited to water, oil, alcohol, or other suitable liquid coolant. Since many types of active circuitry operate at a temperature above 120 degrees Celsius, the fluid medium used may be one that has a boiling point above 120 degrees Celsius. This can prevent failures attributed to heating the fluid medium to a point where the fluid medium may change phase.

In some embodiments, the stacked substrates may not include a pump and instead the fluid medium may move with natural fluid movement, from hot zones to cool zones, i.e., convection. As one portion of the active circuitry heats up the fluid medium, the fluid medium will begin to move through the channels from the cooler zones toward the heated area. This will bring cooler fluid medium to the active circuitry generating the heat.

Figure 14:
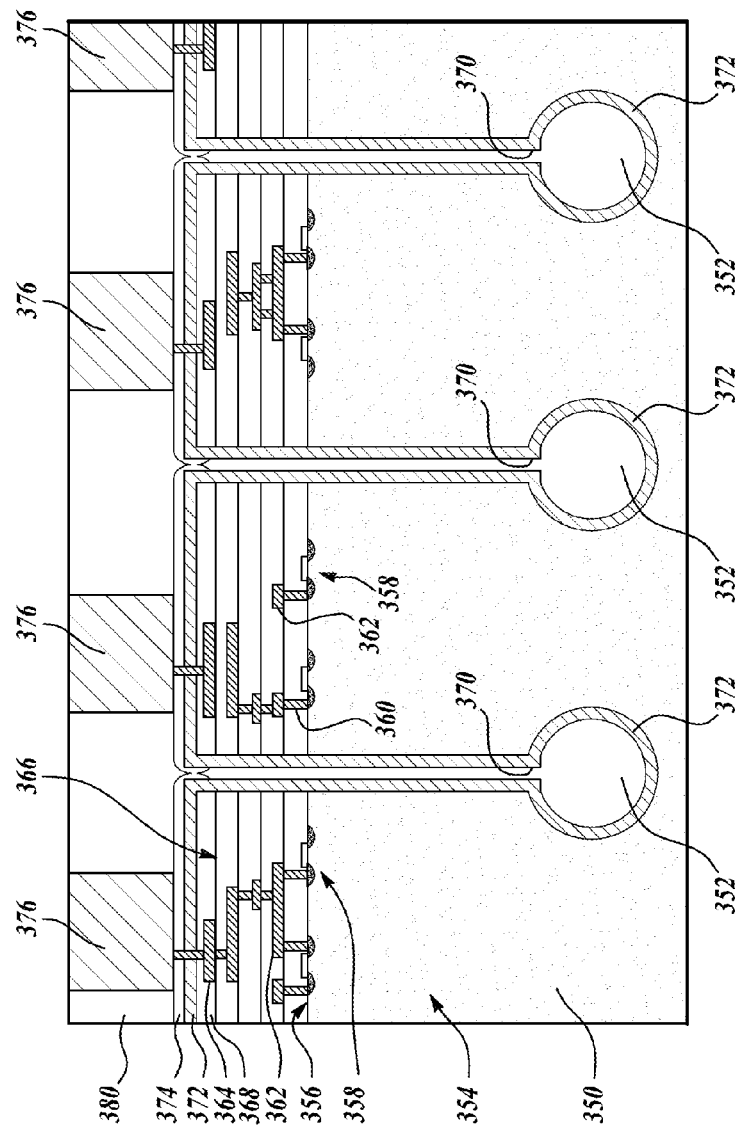
FIG. 14 is a cross-sectional view of an alternative embodiment of the present disclosure.

FIG. 14 is a cross-sectional view of an alternative embodiment of one of the substrates of the stacked substrates. A substrate 350 may be silicon, silicon germanium, or other suitable semiconductor substrate. The substrate 350 is thick, for example, 200-300 microns. In most manufacturing processes, a backside of a wafer is polished or otherwise removed after the active circuitry has been formed. This makes thinner die to be included in the final packages to be sent to customers. In this embodiment, the extra portions of the wafer remain in order to accommodate channels 352 in the substrate 350.

The channels 352 are formed after active circuitry 354 is formed in and on a surface 356 of the substrate 350. The active circuitry 354 includes a plurality of transistors 358, which each include source/drain regions and a gate. A plurality of conductive vias 360 and conductive lines 362 couple some of the source/drain regions to each other and move the electrical signals across the substrate. In addition, these conductive vias and lines transfer the electrical signals to contact pads 364 on a top surface 366.

Once the active circuitry is complete, a passivation layer 368 is formed over the contact pads 364. Next, a plurality of trenches 370 are formed from a top surface and spaced between portions of active circuitry 354. The trenches 370 are formed in segments, which will be described in more detail with respect to FIG. 15. Once the trenches 370 reach a selected depth, the channels 352 are formed by removing portions of the substrate through the trenches. The trenches are significantly thinner than a diameter of the channels 352. In this embodiment, the channels are circular or round; however in other embodiments, the channels may be other shapes.

The shape of the channel is dependent on the etch techniques used to remove portions of the substrate.

A dielectric layer 372 lines the trenches and the channels. This acts as a barrier layer between the fluid medium and the substrate. After the channels are formed, another dielectric layer 374 is formed across a top surface to seal the openings associated with the trenches 370. For example, the dielectric layer 374 may be silicon nitride. As the dielectric layer 374 is deposited, it begins to line sidewalls of the trenches, until the trench is sealed. In some embodiments the trenches will remain open where a surface tension of the fluid medium will contain the fluid medium in the channels.

Pillars 376 are formed on top of the dielectric layer 374. Conductive vias 378 are formed through the dielectric layers 374, 372 and passivation layer 368 to couple the contact pads 364 to the pillars 376.

The pillars 376 may be formed as through silicon vias, in that a thick dielectric layer 380 is formed above the dielectric layer 374. Openings are formed through the thick dielectric layer 380 and conductive pillars 376 are formed in the openings. In some embodiments, the dielectric layer 380 remains and in others the dielectric layer 380 may be removed.

The pillars in this cross-sectional view are all solid. In other cross-sectional views, not shown, hollow pillars are formed to couple the channels to a second substrate.

Figure 15:
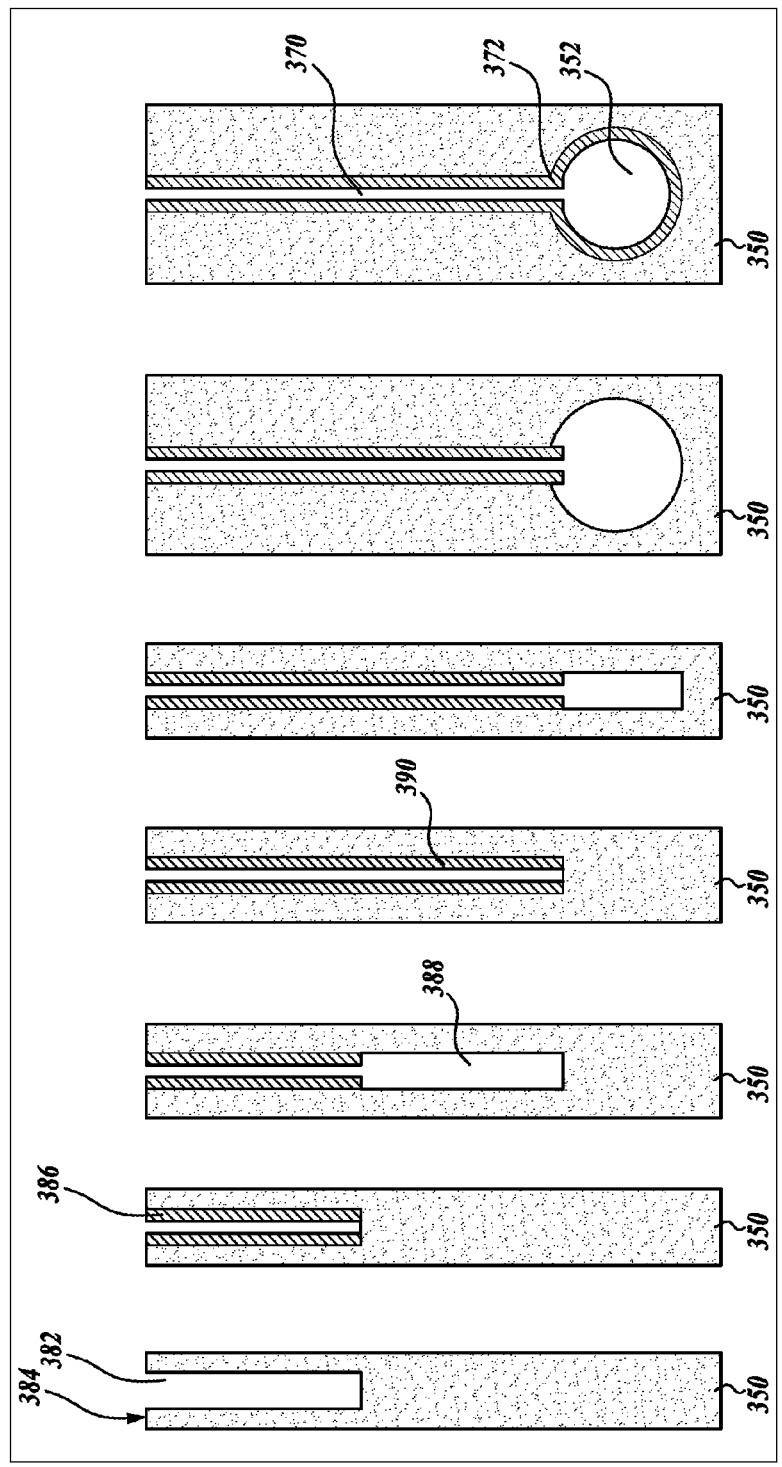
FIG. 15 shows a plurality of steps for forming a through silicon via structure according to the present disclosure.
Figure 18:
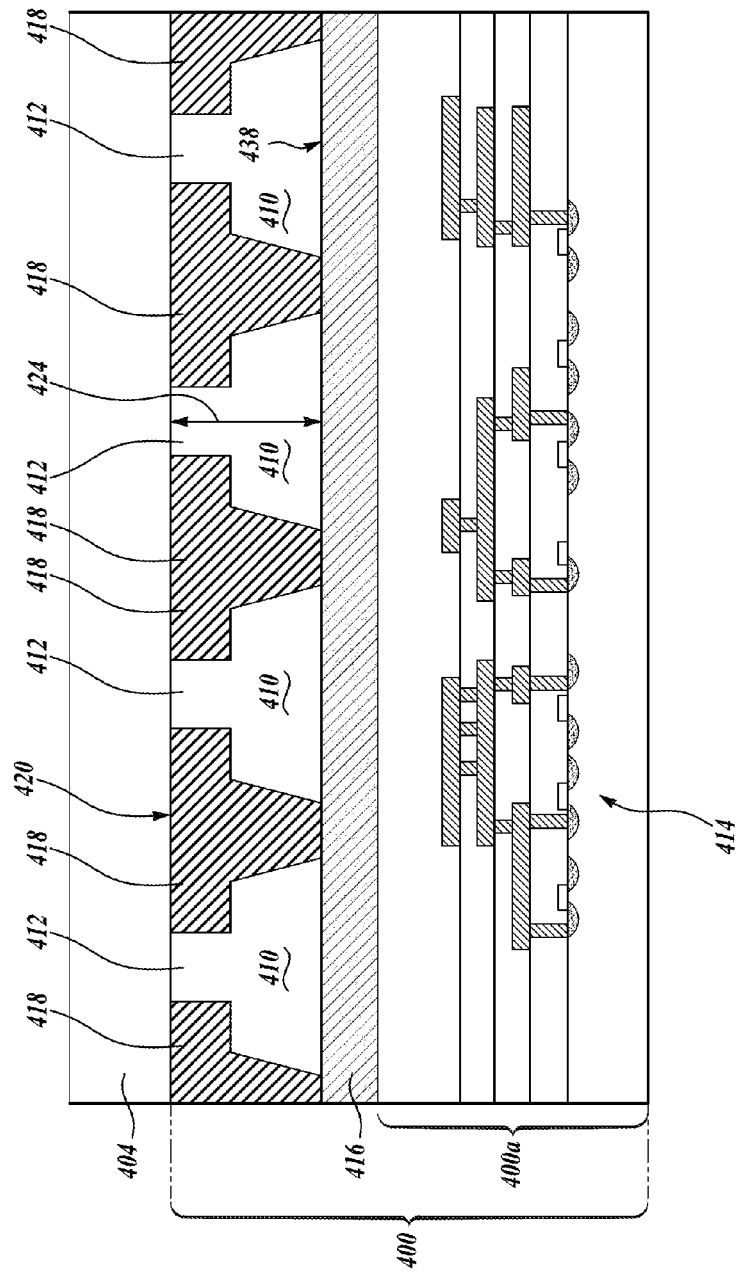
FIGS. 18 through 28 are a series of process steps configured to form through silicon via structures according to an embodiment of the present disclosure.

FIG. 15 is a series of manufacturing steps to form the channel 352. This is an enhanced view of one of the channels of FIG. 14. For simplicity, only the channel and trench 370 are shown. Starting with the left-most segment, a first trench portion 382 is formed in a top surface 384 of the substrate 350. The first trench portion 382 has a depth that corresponds to a limit of the etch technique. Further etching past the depth can cause the etch to move wider towards the conductive lines, in FIG. 14. The width of the trench must be continued to avoid damage to adjacent portions of the active circuitry.

After the first trench portion 382 is formed, sidewalls of the first trench portion 386 are lined with a first dielectric portion 386. The first dielectric portion 386 protects the sidewalls to prevent over etching as the channel is formed. Next, a second trench portion 388 is formed and lined with a second dielectric portion 390. This process of etching a trench portion and lining the sidewalls is continued until a selected depth is reached. The trenches are formed with an anisotropic etch and the channels are formed with an isotropic etch. Once the diameter of the channel is reached, the sidewalls of the channel are lined with the dielectric 372.

FIG. 16 is a top down view of a first substrate 400 of a stacked substrate arrangement 402 of FIG. 17. In this arrangement 402, the first substrate includes active circuitry and a second substrate 404 is a cap. The cap may include a pump or may be coupled to an external pump through openings 406.

The top down view includes four rectangular openings 408 positioned along a right-hand side of the substrate. Each pair of the openings 408 is coupled together to form a chamber 410 through which fluid can flow to cool the active circuitry. A trench 412 is formed in the top surface and provides access to the chamber 410. Formation of the trench 412 will be described in more detail below.

FIGS. 18-28 are a series of manufacturing steps to form the chambers 410 of the substrate 400. The substrate 400 includes a plurality of layers 400a that include active circuitry 414, which includes a plurality of active and passive electrical components, like transistors and resistors. In this embodiment, the chambers are on a top side of the active circuitry as opposed to the channels formed in the substrate below the active circuitry in the figures above.

A dielectric layer 416 is formed above the layers that include the active circuitry 414. The chambers are separated from each other by structures 418 described in more detail below. The structures 418 are separated from each other by the trenches 412. In FIG. 16, a top surface 420 of the structures 418 extend between the trenches 412. The second substrate 404 seals the trenches 412 to keep the fluid medium in the chambers 410.

Figure 19:
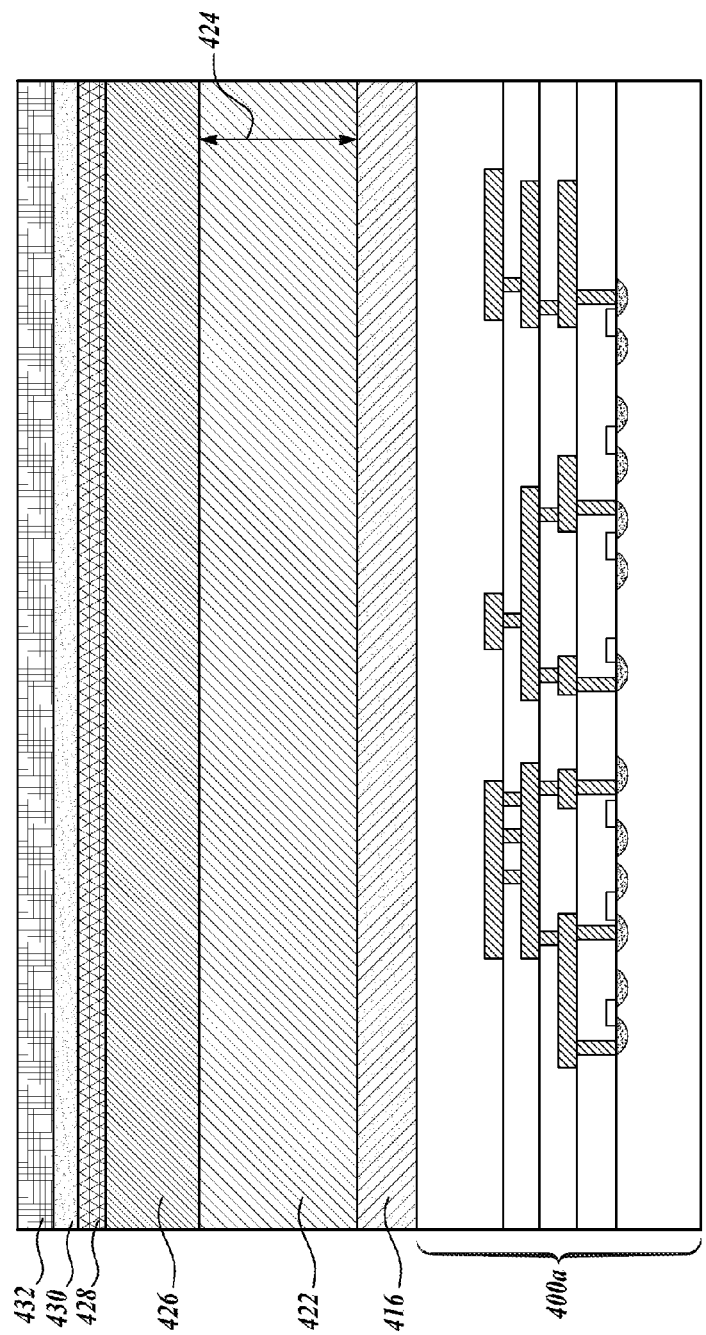

The dielectric layer 416 is a passivation layer to electrically isolate the active circuitry from the chambers 410. In FIG. 19, a thick sacrificial dielectric layer 422 is formed on the passivation layer 416. The sacrificial dielectric layer may be any thickness sufficient to form a height 424 of the chamber 410. The sacrificial layer may be a TEOS layer (Tetraethyl orthosilicate) or other suitable sacrificial layer.

A hard mask 426 is formed on top of the sacrificial layer 422. The hard mask may be titanium nitride or other suitable masking layer. A planarizing layer 428 is formed on the hard mask 426. The planarizing layer 428 may be spun on and cured to form a flat surface. An antireflective coating 430 is then formed on top of the planarizing layer 428. The antireflective coating 430 may be a silicon ARC or another suitable material. A photoresist 432 is formed on the antireflective coating.

Figure 20:
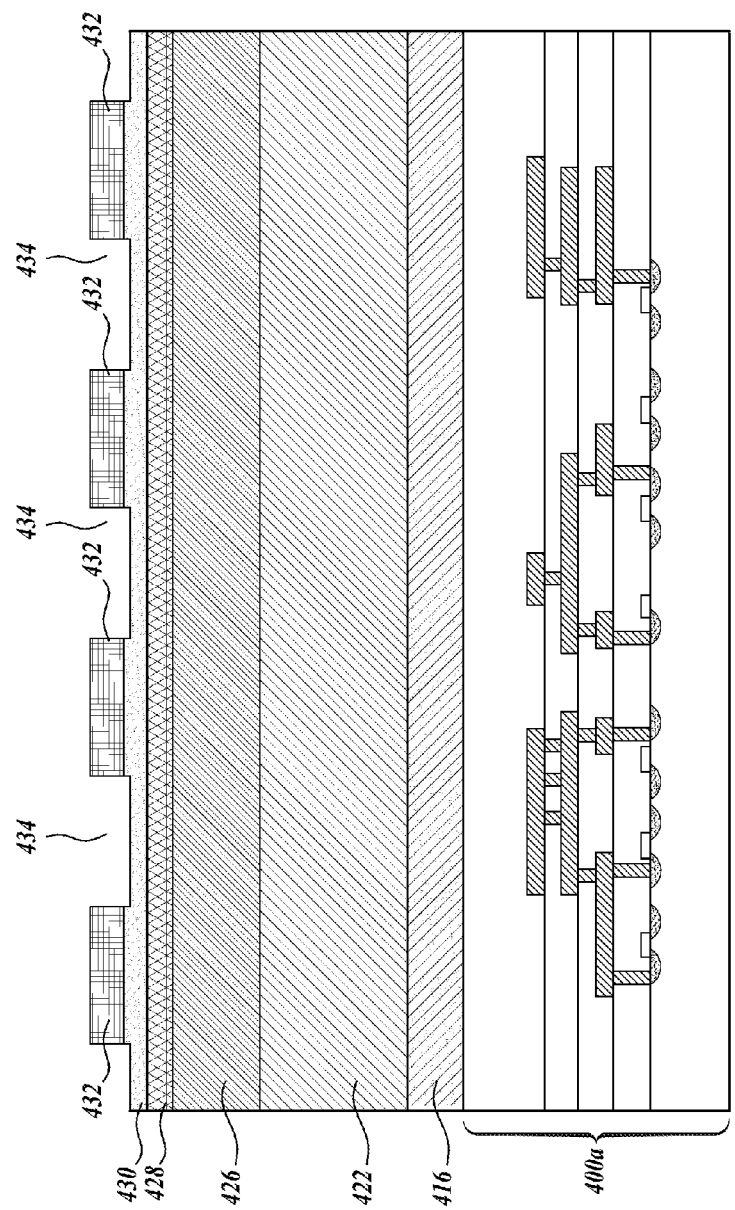
Figure 21:
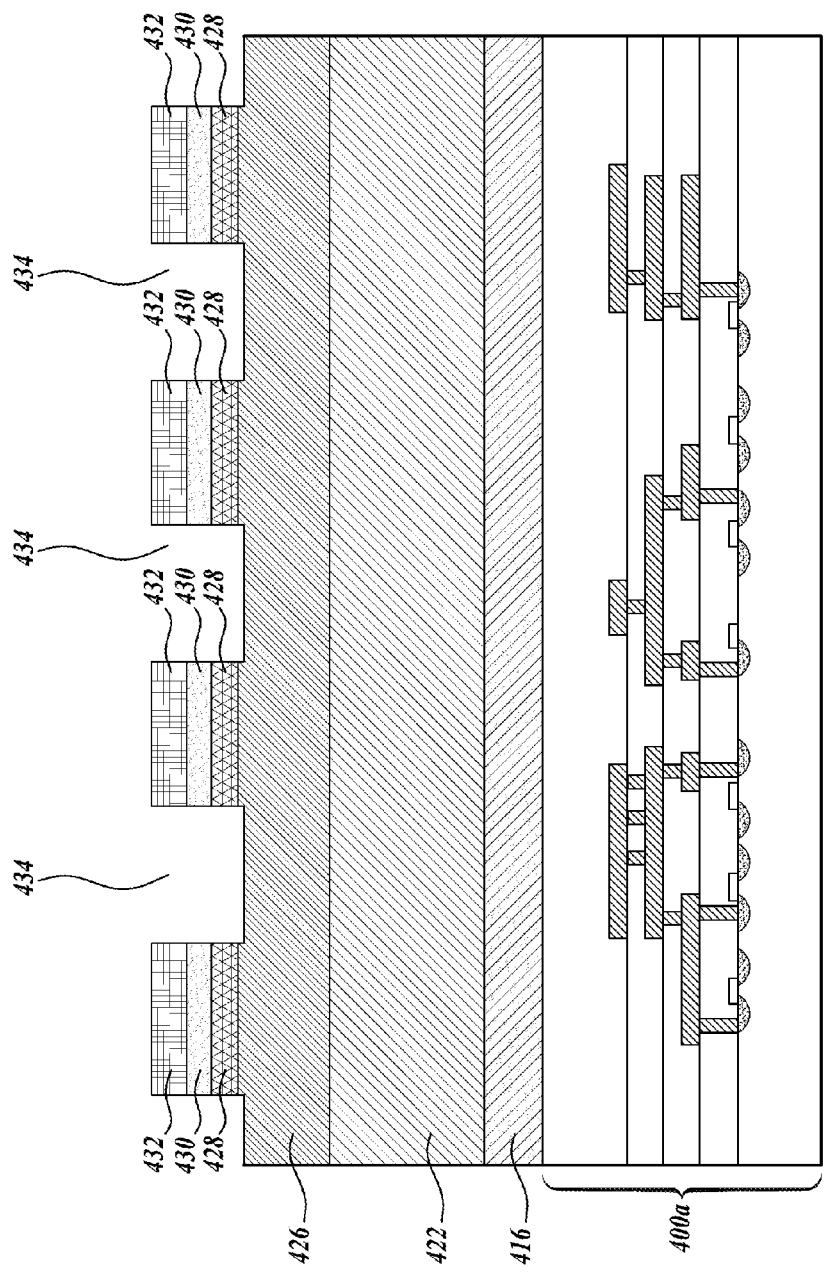

In FIG. 20, openings 434 are formed through the photoresist by known techniques. Portions of the antireflective coating may be removed as the openings 434 are formed. In FIG. 21, portions of the antireflective coating 430 and the planarizing layer 428 are removed and the openings 434 become deeper. The openings 434 reexpose a portion of the hard mask 426. The etch to form the openings may be reactive ion etching, RIE.

Figure 22:
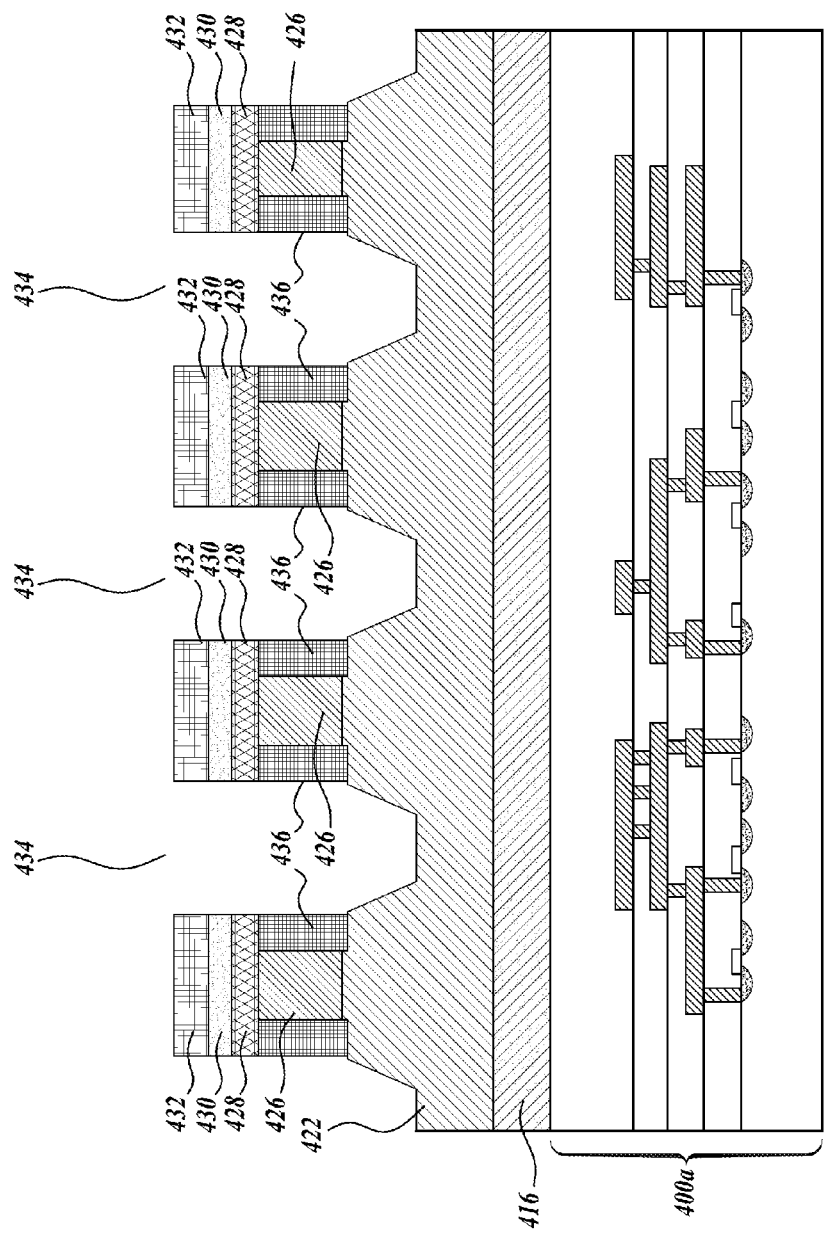

In FIG. 22, the openings 434 are expanded into the sacrificial layer. The etch to form the openings 434 through the hard mask 426 may remove portions of the hard mask 426 while growing spacers 436 of titanium nitride.

Figure 23:
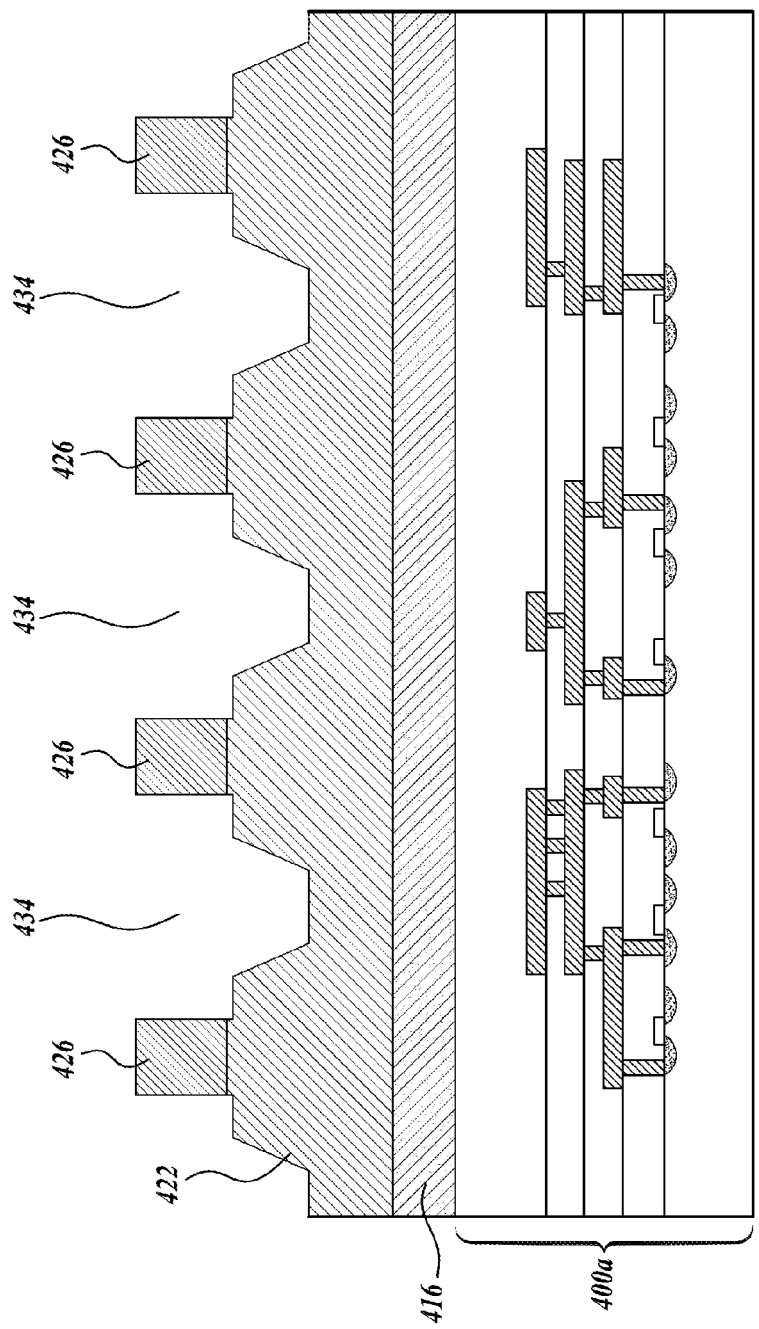
Figure 24:
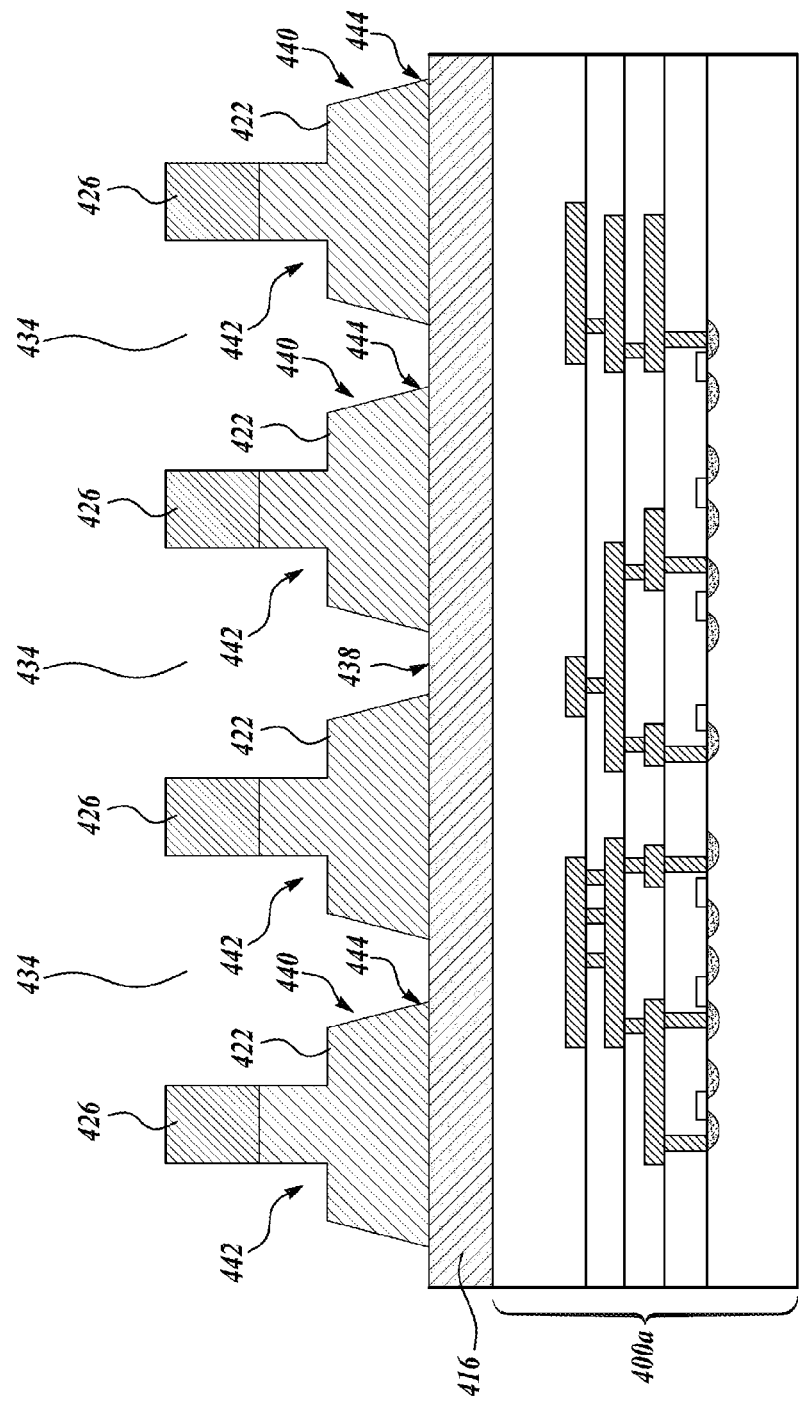

An ash and wet clean removes the photoresist 432, the antireflective coating 430, the planarizing layer 428, and the spacers 436, see FIG. 23. In FIG. 24, the remaining hard mask 426 is used as a further or continued etch is performed. It may be an anisotropic etch to form a dual damascene structure within the sacrificial layer 422. The openings 434 are expanded to reexpose a top surface 438 of the passivation layer 416. The sacrificial layer has a wider portion 440, which is a lower portion of the sacrificial layer, and a narrower portion 442 above the wider portion 440. The wider portion 440 has angled sidewalls 444 in this embodiment; however, in other embodiments, the wider portion 440 may have more vertical sidewalls.

Figure 25:
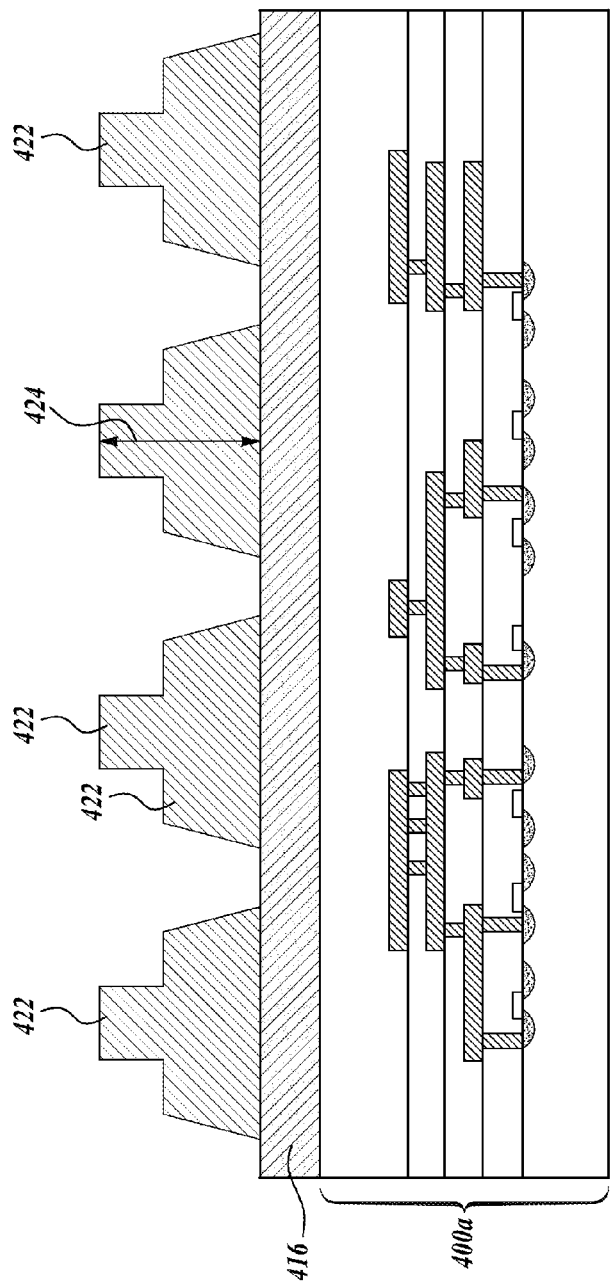
Figure 26:
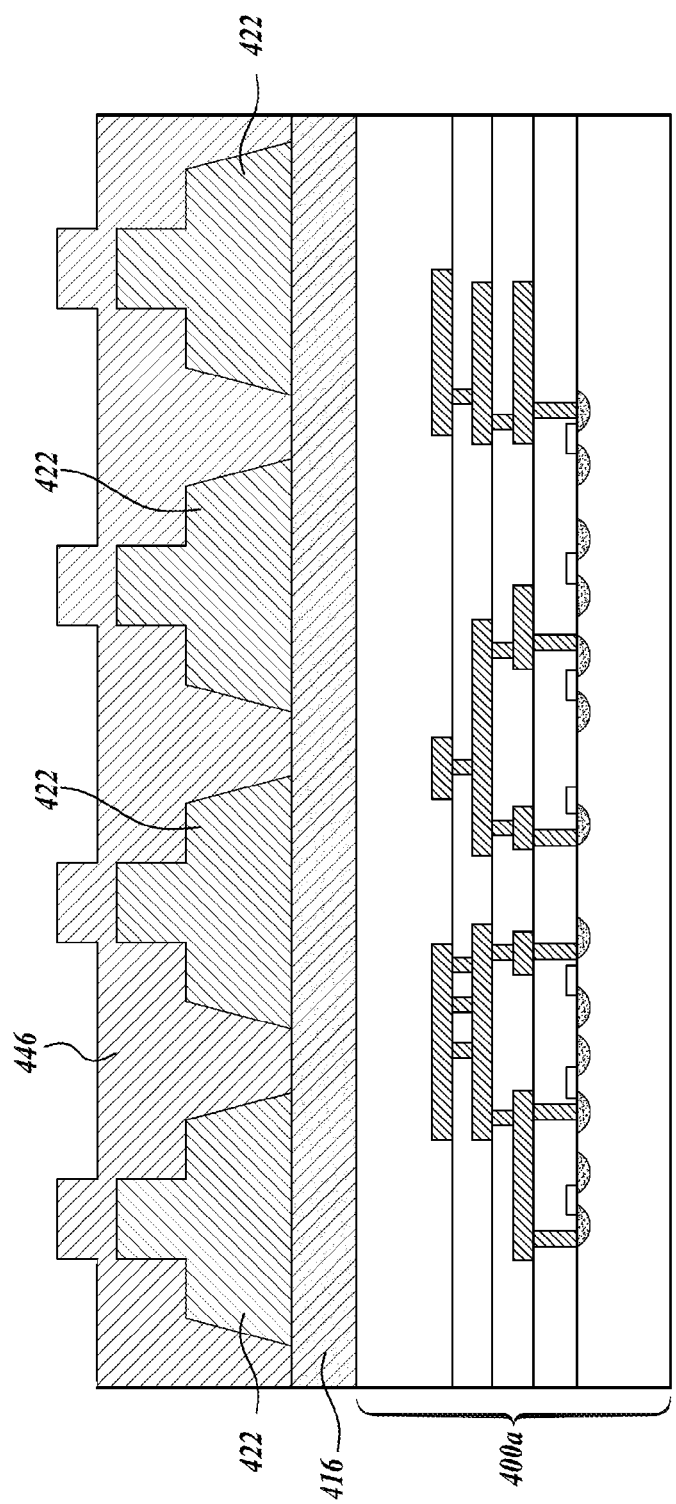

In FIG. 25, the hard mask 426 is removed and the shaped sacrificial layer 422 remains. In FIG. 26, a dielectric layer 446 is formed on the shaped sacrificial layer 422 and in the openings 434. The dielectric layer 446 is selected to have a different etch selectivity than the sacrificial layer 422. For example, if the sacrificial layer is TEOS, then the dielectric layer 446 is silicon nitride.

Figure 27:
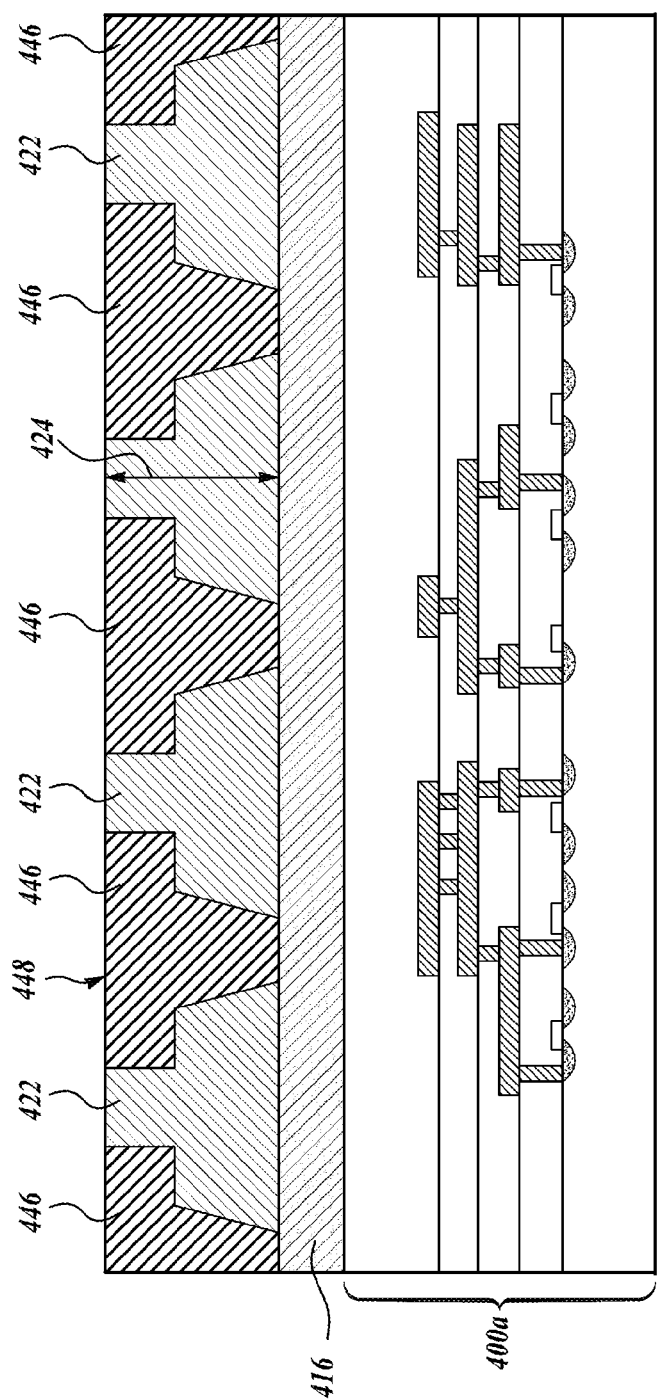
Figure 28:
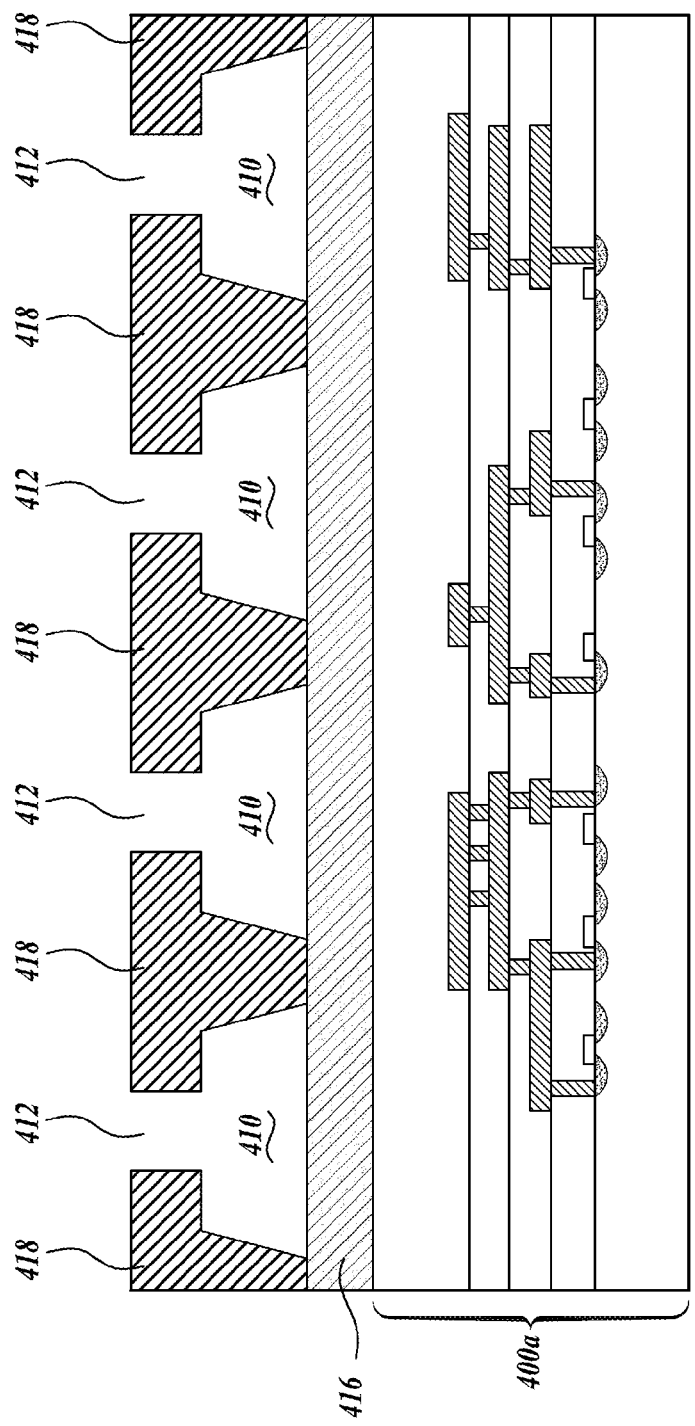

In FIG. 27, a chemical mechanical polish is performed to remove high portions of the dielectric layer 446 and the sacrificial layer 422. The polish forms a flat or planar surface 448. In FIG. 28, a release is performed to remove the sacrificial layer 422 and form the chambers 410.

The present disclosure is directed to providing in situ cooling for stacked substrates, where the substrates may both have active circuitry or only one of them may have active circuitry. Although only two stacked substrates have been described herein, it is possible that the chambers and channels may be formed and coupled between a larger number of substrates.

Although all of the hollow pillars described herein have equal diameters, it is possible that different pillars may have different diameters on the same substrate. In addition, some pillars may have oval openings as opposed to circular openings. In addition, in other embodiments, the hollow pillars will be able to transfer data electrically through the walls of the hollow pillars while also transmitting data optically through the hollow portion of the pillars. The size and shape of the pillars and the openings through the pillars may be selected based on the cooling requirements of the associated substrate.

In some embodiments, depending on the electrical characteristics of the fluid medium, an interior surface of the pillars may be lined with a dielectric to isolate the fluid medium from the conductive pillars. The top and bottom pillars may be coupled together using conductive glue or other adhesive.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first substrate having:
 a first plurality of hollow pillars on the first substrate; and
 a first plurality of channels in the first substrate coupled to the first plurality of hollow pillars;
a second substrate attached to the first substrate, the second substrate having:
 a second plurality of hollow pillars on the second substrate; and
 a second plurality of channels in the second substrate coupled to the second plurality of hollow pillars, the first plurality of hollow pillars being coupled to the second plurality of hollow pillars to allow a fluid medium to move through the first and second plurality of channels to cool the first substrate and the second substrate.

2. The device of claim 1 wherein the first substrate includes active circuitry.

3. The device of claim 2 wherein the second substrate includes active circuitry.

4. The device of claim 2 wherein the second substrate includes a microfluidic pump coupled to the second plurality of channels to move the fluid medium.

5. The device of claim 1 wherein the first substrate includes a first plurality of solid pillars adjacent to the first plurality of hollow pillars.

6. A device, comprising:
a first substrate that includes:
 a first opening in a surface of the first substrate;
 a second opening in the surface of the first substrate;
 a first channel extending between the first opening and the second opening;
 a first hollow pillar positioned over the first opening and coupled to the first channel;
 a second hollow pillar position over the second opening and coupled to the first channel; and
a second substrate including:
 a third opening in a surface of the second substrate;
 a fourth opening in the surface of the second substrate;
 a second channel extending between the first opening and the second opening, the first hollow pillar and the second hollow pillar coupled to the third opening and the fourth opening of the second substrate, respectively.

7. The device of claim 6 wherein the first substrate includes active circuitry and a first electrical connection and a second electrical connection coupled to the active circuitry, the first and second hollow pillars being configured to electrically transmit signals from the first electrical connection and the second electrical connection, respectively.

8. The device of claim 7, further comprising a plurality of third solid pillars positioned between the surface of the first substrate and the surface of the second substrate.

9. The device of claim 8 wherein the third solid pillars are configured to transmit signals from a plurality of third electrical connections from the active circuitry.

10. The device of claim 6, further comprising a plurality of third solid pillars positioned between the surface of the first substrate and the surface of the second substrate.

11. The device of claim 6 wherein the first substrate includes a chamber, the first channel being configured to move fluid through the first substrate from the chamber.

12. The device of claim 6 wherein the first substrate includes a trench that extends between the first opening and the second opening, the trench having a width that is smaller than a width of the first channel.

13. The device of claim 6 wherein the first channel is circular in cross-section, the channel having a diameter that corresponds to a diameter of a hollow portion of the first hollow pillar.

14. A method, comprising:
forming a first opening and a second opening in a surface of a first substrate;
forming a first channel between the first opening and the second opening;
forming a third opening and a fourth opening in a surface of a second substrate;
forming a second channel between the third opening and the fourth opening;
forming a first pillar coupled between the first opening and the third opening; and
forming a second pillar coupled between the second opening and the fourth opening, the first channel and the second channel being in fluid communication through the first, second, third, and fourth openings.

15. The method of claim 14, further comprising forming a chamber in the first substrate coupled to the first channel and forming a pump in the first substrate to move fluid from the chamber through the first and second channels.

16. The method of claim 14 wherein forming the first channel includes:
forming a trench in the surface of the first substrate extending between the first and the second openings;
forming a dielectric layer on an interior surface of the trench;

forming the channel through the trench, a width of the channel being significantly larger than a width of the trench.

17. The method of claim 16, further comprising forming active circuitry in the first substrate prior to forming the first channel, the first channel being positioned at a depth further from the surface than the active circuitry.

18. The method of claim 14 wherein forming the first channel includes:

forming a sacrificial layer on the surface of the first substrate;

forming a channel support layer on the sacrificial layer;

forming the first and the second openings through the channel support layer; and removing the sacrificial layer.

\* \* \* \* \*